(12) United States Patent
Wang et al.

(10) Patent No.: US 10,741,623 B2
(45) Date of Patent: Aug. 11, 2020

(54) OLED DEVICE WITH LOWERED CARRIER-TRANSPORTING CAPABILITY AND METHOD FOR MANUFACTURING THE SAME

(71) Applicant: BOE TECHNOLOGY GROUP CO., LTD., Beijing (CN)

(72) Inventors: Dan Wang, Beijing (CN); Na Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/855,248

(22) Filed: Dec. 27, 2017

(65) Prior Publication Data
US 2018/0337222 A1 Nov. 22, 2018

(30) Foreign Application Priority Data
May 19, 2017 (CN) .......................... 2017 1 0358717

(51) Int. Cl.
*H01L 27/32* (2006.01)
*H01L 51/50* (2006.01)
(Continued)

(52) U.S. Cl.
CPC ...... *H01L 27/3246* (2013.01); *H01L 27/3211* (2013.01); *H01L 51/0021* (2013.01);
(Continued)

(58) Field of Classification Search
CPC ............. H01L 27/3246; H01L 27/3211; H01L 51/0017; H01L 51/5012; H01L 51/5056
(Continued)

(56) References Cited

U.S. PATENT DOCUMENTS

2005/0263757 A1* 12/2005 Lee ...................... H01L 27/3211
257/40
2006/0240281 A1* 10/2006 Liao .................... H01L 51/5206
428/690
(Continued)

FOREIGN PATENT DOCUMENTS

| CN | 103887261 A | 6/2014 |
|---|---|---|
| CN | 106469742 A | 3/2017 |

OTHER PUBLICATIONS

First Office Action for CN Application No. 201710358717.7, dated Apr. 17, 2019.
(Continued)

*Primary Examiner* — Lex H Malsawma
*Assistant Examiner* — Eric W Jones
(74) *Attorney, Agent, or Firm* — Dinsmore & Shohl LLP

(57) ABSTRACT

The present disclosure relates to a method of manufacturing an OLED device, an OLED device and a display panel. The method comprises: forming a first electrode layer over a substrate; forming a pixel define layer over the first electrode layer, the pixel define layer having a plurality of openings each corresponding to a light emitting region of each sub-pixel unit; performing a roughening process over a surface of the pixel define layer apart away from the first electrode layer; forming a hole injection layer covering the pixel define layer and the openings; and forming a hole transport layer, a light emitting layer, an electron transport layer and a second electrode layer in sequence over the hole injection layer at regions corresponding to the openings.

19 Claims, 3 Drawing Sheets

(51) Int. Cl.
　　 *H01L 51/52* (2006.01)
　　 *H01L 51/00* (2006.01)
　　 *H01L 51/56* (2006.01)

(52) U.S. Cl.
　　 CPC ...... *H01L 51/5012* (2013.01); *H01L 51/5056* (2013.01); *H01L 51/5072* (2013.01); *H01L 51/5088* (2013.01); *H01L 51/5092* (2013.01); *H01L 51/5206* (2013.01); *H01L 51/0017* (2013.01); *H01L 51/56* (2013.01)

(58) Field of Classification Search
　　 USPC ............................ 257/40, 59, 79, 98; 438/99
　　 See application file for complete search history.

(56) References Cited

U.S. PATENT DOCUMENTS

| | | | |
|---|---|---|---|
| 2012/0001207 A1* | 1/2012 | Lee | H01L 51/5203 257/89 |
| 2012/0126219 A1* | 5/2012 | Sato | H01L 51/5016 257/40 |
| 2013/0186467 A1* | 7/2013 | Saeki | B29C 33/424 136/259 |
| 2014/0042402 A1* | 2/2014 | Prushinskiy | H01L 51/5203 257/40 |
| 2014/0319477 A1* | 10/2014 | Kim | H01L 27/3246 257/40 |
| 2015/0060826 A1* | 3/2015 | Matsumoto | H01L 27/3246 257/40 |
| 2016/0056219 A1* | 2/2016 | Kim | H01L 51/5072 257/40 |
| 2016/0155784 A1* | 6/2016 | Park | H01L 27/3246 257/88 |
| 2017/0117337 A1* | 4/2017 | Kimura | H01L 27/3246 |

OTHER PUBLICATIONS

Second Office Action for CN Appl. No. 201710358717.7, dated Oct. 9, 2019.

* cited by examiner

OLED DEVICE WITH LOWERED CARRIER-TRANSPORTING CAPABILITY AND METHOD FOR MANUFACTURING THE SAME

CROSS-REFERENCE TO RELATED APPLICATIONS

The present application claims priority to Chinese Application No. 201710358717.7 filed on May 19, 2017, which is incorporated herein by reference in its entity including the Description, the Claims and the Drawings.

TECHNICAL FIELD

The present disclosure relates to the field of display technology, and particularly to a method of manufacturing OLED device, an OLED device and a display panel.

BACKGROUND

Recently, OLED (Organic Light Emitting Diode) as new flat panel display technology has received more attentions. OLED may possibly become a next-generation display technology replacing liquid crystal displays because it has active emission, high brightness, high resolution, wide viewing angle, fast response, low energy consumption and flexibility.

The commonly used RGB light emitting units in the most of current OLED device structures share a common hole injection layer (HIL). Using HIL as a common layer can reduce a reticle and related processes and thus the process flow is simplified. However, there is a problem with this solution that, when a turn-on voltage is applied to a unit device of one color, directional transmission of carriers may occur due to the good carrier-transporting performance of the HIL and a large difference (i.e., voltage difference) in the turn-on voltages of devices of different colors, as a result, unit devices of other colors are also turned on. This problem is more serious in low gray scales.

Thus, it is desirable to provide a method of manufacturing an OLED device and an OLED device capable of alleviating or solving one or more of the above problems.

It should be noted that the information disclosed in BACKGROUND is merely for enhancing the understanding of the background of the present disclosure and therefore may contain some information that does not pertain to the prior art that has already known by those with ordinary skills in the art.

SUMMARY

An object of some embodiments of the present disclosure is to provide a method of manufacturing an OLED device, an OLED device and a display panel which can alleviate or address one or more of the problems due to limitations and disadvantages of the related art.

According to an aspect of the present disclosure, a method of manufacturing an OLED device is provided which may comprise: providing a substrate having a first electrode layer thereon; forming a pixel define layer for defining a sub-pixel unit over the first electrode layer, the pixel define layer having at least one opening each exposing a part of the first electrode layer; performing a roughening process on at least a part of an upper surface, which is away from the first electrode layer, of the pixel define layer to form a rough surface; and forming a first functional layer for a light-emitting part of the subpixel unit to cover the processed pixel define layer and the exposed part of the first electrode layer, wherein the part of the first functional layer, that is formed over the rough surface, has a lowered carrier-transporting capability in a direction, which the first functional layer extends in, than other parts of the first functional layer.

In some illustrative embodiments, the first functional layer may be a functional layer for a light-emitting part of the subpixel unit.

In some illustrative embodiments, the method may further comprises: forming a stack of functional layers over the first functional layer and a second electrode layer over the stack; and etching the second electrode layer and the stack to the first electrode layer, to form a light-emitting region of the sub-pixel unit, wherein the exposed part of the first electrode layer corresponds to a respective light-emitting region.

In some illustrative embodiments, performing a roughening process on at least a part of an upper surface of the pixel define layer may comprise: performing an ashing process, a plasma process, or a sputtering process with metal, on said at least a part of the upper surface of the pixel define layer.

In some illustrative embodiments, performing a roughening process on at least a part of an upper surface of the pixel define layer may comprise: forming a mask over the pixel define layer and the exposed part of the first electrode layer, the mask exposing said at least a part of the upper surface of the pixel define layer; performing a surface process on said at least a part of the upper surface of the pixel define layer by an ashing process, a plasma process, or a sputtering process with metal; and removing the mask after the surface process.

In some illustrative embodiments, performing a roughening process on at least a part of the upper surface of the pixel define layer may be conducted according to a thickness of the first functional layer.

In some illustrative embodiments, the first electrode layer may comprise a composite layer of indium tin oxide/silver/indium tin oxide.

In some illustrative embodiments, the first functional layer may have a thickness of about 50 nm to about 100 nm, and the rough surface may have a surface roughness of about 50 nm to about 100 nm.

In some illustrative embodiments, the first functional layer may comprise a hole injection layer, and the stack may comprise a hole transport layer over the hole injection layer, a light emitting layer over the hole transport layer, and an electron transport layer over the light emitting layer.

In some illustrative embodiments, the stack further may comprise an electron injection layer interposed between the electron transport layer and the second electrode layer.

In some illustrative embodiments, the first functional layer may comprise an electron injection layer or an electron transport layer.

According to another aspect of the present disclosure, an organic light-emitting diode (OLED) device is provided which may comprise: a substrate having a first electrode layer thereon; a pixel define layer for defining a sub-pixel unit over the first electrode layer, the pixel define layer having at least one opening each exposing a part of the first electrode layer; and a first functional layer for a light-emitting part of the subpixel unit, formed over the pixel define layer and the exposed part of the first electrode layer, wherein at least a part of an upper surface of the pixel define layer has a rough surface, so that a part of the first functional layer, that is formed over the rough surface, has a lowered carrier-transporting capability in a direction, which the first functional layer extends in, than other parts of the first functional layer, and wherein the upper surface of the pixel define layer is a surface away from the first electrode layer.

In some illustrative embodiments, the OLED device may further comprise: a stack of functional layers over an area of the first functional layer corresponding to the respective opening, and a second electrode layer over the stack.

In some illustrative embodiments, the first functional layer may have a thickness of about 50 nm to about 100 nm, and the rough surface may have a surface roughness of about 50 nm to about 100 nm.

In some illustrative embodiments, the first functional layer may comprise a hole injection layer. The stack may comprise a hole transport layer over the hole injection layer, a light emitting layer over the hole transport layer, and an electron transport layer over the light emitting layer.

In some illustrative embodiments, the stack may further comprise an electron injection layer interposed between the electron transport layer and the second electrode layer.

In some illustrative embodiments, the first functional layer may comprise an electron injection layer or an electron transport layer.

In some illustrative embodiments, the first electrode layer may comprise a composite layer of indium tin oxide/silver/indium tin oxide.

According to a yet another aspect of the present disclosure, a display panel comprising the OLED device according to any embodiments described as above or below in detail.

According to the methods of manufacturing an OLED device, the OLED devices and the display panel of the illustrative embodiments of the present disclosure, the first functional layer can be wrinkled, fractured or unevenly deposited when the first functional layer is formed. Thereby, the carrier transportability of the first functional layer in a desirable direction can be greatly reduced, and crosstalk can thus be reduced. On the other hand, since the surface process to the pixel define layer is performed before the forming of the stack of functional layers, the interference to the stack to be formed can be reduced. Further, the manufacture cost can be reduced.

It should be noted that both the foregoing general description and the following detailed description are only illustrative and explanatory, and are not limiting for the present disclosure.

BRIEF DESCRIPTION OF THE DRAWINGS

Herein, the accompanying drawings, which are incorporated in and constitute a part of this specification, illustrate embodiments of the present disclosure and, together with the description, serve to explain the principles of the present disclosure. It is obvious that, the drawings illustrated as follows are merely some of the embodiments of the present disclosure. For a person skilled in the art, he or she may also acquire other drawings or embodiments on basis of the drawings without need of any inventive effort.

Figure 1:
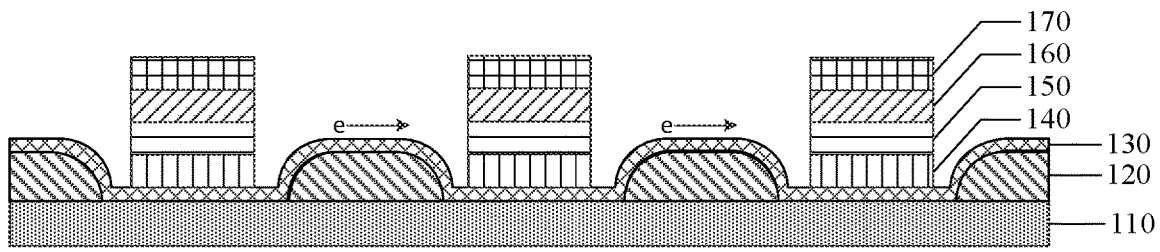
FIG. 1 illustratively shows a schematic view of a structure of an OLED device according to a technical solution.

It is to be noted that throughout the various views of these drawings, the like or corresponding reference numbers are used to represent the like components or features or corresponding components or features have the same or similar function, and thus the repeat description thereof will be omitted in the following detailed description.

It is also to be noted that the positions, sizes, and ranges of the elements as illustrated in the drawings are not necessarily denote the real positions, sizes, and ranges. And thus, the present disclosure shall be not limited to or by these positions, sizes, and ranges obtained from the drawings.

DETAILED DESCRIPTION

Various illustrative embodiments of the present disclosure will now be described in detail with reference to the accompanying drawings. However, the embodiments may be implemented in many different forms and should not be construed as being limited to the precise forms of the embodiments as set forth herein. Rather, these embodiments are provided by way of example so as to facilitate a thorough and complete understanding of the principles and scope of the present disclosure, and to fully convey the concept of the illustrative embodiments to those skilled in the art. The described features, structures, or characteristics may be combined in any suitable manner in one or more embodiments. In the following description, numerous specific details are provided to provide a thorough understanding of embodiments of the present disclosure. Those skilled in the related arts can practice the technical solutions of the present disclosure without one or more of the specific details, or with other methods, components, devices, steps, etc. In some other instances, some well-known knowledge is not shown or described in detail to avoid obscuring the fists and the aspects of the present disclosure.

Further, it should be understood that the drawings of the present disclosure are only illustrative and are not necessarily drawn to scale. Like reference numerals in the drawings denote the same or like elements, and thus their repeat description will be omitted. Some of the blocks shown in the drawings are functional entities, which do not necessarily correspond to physically or logically separate entities. These functional entities may be implemented in the form of software or in one or more hardware modules or integrated circuits, or may be implemented in different networks and/or processor devices and/or microcontroller devices.

For ease of description, spatial relationship terms such as "below . . . ", "under . . . ", "lower", "above . . . ", "upper" or the like are used herein to describe the relationship between one element or feature and other element or feature (or other elements or features) shown in the figures. It should be understood that the spatial relationship terms are intended to encompass different orientations of the device in use or operation in addition to the orientations shown in the figures. For example, if the device illustrated in the figures is turned over, elements described as "below" or "under" the other elements or features would then be "above" the other elements or features. Thus, the device may be positioned in other way (for example, rotated by 90 degrees or at other orientations) and the spatial relationship descriptors used herein would be interpreted accordingly.

The terms used herein are for the purpose of describing particular illustrative embodiments only and are not intended to limit the invention. As used herein, the singular forms "a", "an" and "the" and variations thereof are intended to include the plural forms as well, unless the context clearly dictates otherwise. It will be further understood that the terms "comprises" and/or "including", when used in this specification, specify the presence of stated features, integers, steps, operations, elements, and/or components, but do not preclude the presence or addition of one or more other features, integers, steps, operations, components, and/or a combination thereof.

FIG. 1 illustratively shows a schematic view of a structure of an OLED device according to a technical solution. As shown in FIG. 1, a pixel define layer (PDL) 120 is deposited over a first electrode layer 110, as a layer for defining sub-pixel units. The first electrode layer 110 can be formed from Indium Tin Oxide/silver/Indium Tin Oxide (ITO/Ag/ITO). Then, functional layers for a light-emitting area (or, light-emitting region) of the sub-pixel units, such as a hole injection layer (HIL) 130, a hole transport layer (HTL) 140, a light emitting layer (EML) 150, and an electron transport layer (ETL) 160, and a second electrode layer 170 can be deposited over the first electrode layer, and be etched down to HIL. Thus, the light-emitting regions for the sub-pixel units can be formed. The HIL is a common layer, i.e., the HIL is shared by all RGB sub-pixel units. Herein, the layer(s) disposed between the first electrode layer and the second electrode layer in the light-emitting region is/are also termed as functional layer(s).

When a turn-on voltage is applied to a sub-pixel unit of one color, if the turn-on voltage of an adjacent sub-pixel unit of another color is less than this voltage, the adjacent sub-pixel unit may also be lit (or, turned on) at the same time, resulting in that it may be difficult to control the turning on of a single color point in the OLED device, and thus color purity of the OLED device may be affected. On the other hand, because of the good carrier transport property of the HIL, when the turn-on voltages of the devices of different colors have large difference therebetween, carriers (e.g., electrons or holes, indicated with e in the drawings) may transport in a certain direction (e.g., in a direction which the HIL extends in). This may cause an unexpected device of other color to be undesirably turned on, and result in cross-talk.

In order to solve this problem, in another technical solution, a deposited (for example, evaporated) HIL layer is subjected to a irradiation treatment. With use of the irradiation with a mask, the bonding of the HIL material between different pixel points can be broken to reduce carrier transporting in the HIL layer. However, according to such a solution, the HIL film needs to be irradiated with light after being deposited. However, such a process is difficult to be performed in a vacuum evaporation chamber. On the other hand, irradiation with mask may cause an operational risk and may impact the property of the HIL and thus impact the performance of the device. Also, the tact time of evaporation may be affected.

Based on the contents described above, the inventors of the present application propose a novel technical solution, which will be described in connection with the drawings as below.

Figure 2:
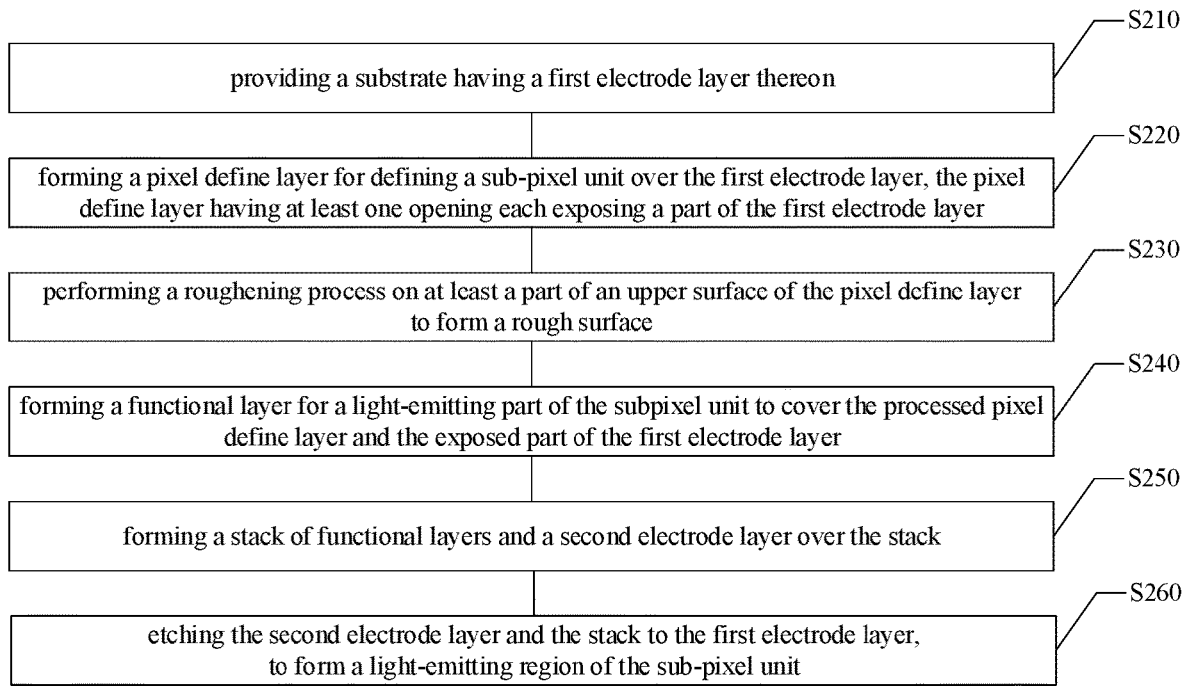
FIG. 2 illustratively shows a flow chart of a method according to an illustrative embodiment of the present disclosure.

FIG. 2 illustratively shows a flow chart of a method according to an illustrative embodiment of the present disclosure. FIG. 3A-3F illustratively shows a schematic view of structures of OLED device according to the steps of a method of manufacturing an OLED device according to an illustrative embodiment of the present disclosure. Descriptions will be given in combination with FIG. 2 and FIGS. 3A-3F.

Figure 3A:
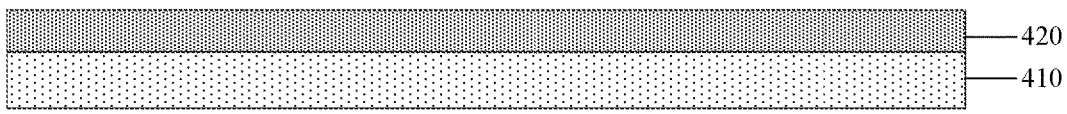
FIG. 3A-3F illustratively shows a schematic view of structures of OLED device according to the steps of a method of manufacturing an OLED device according to an illustrative embodiment of the present disclosure.

At step S210, a substrate 410 is provided which has a first electrode layer 420 formed thereon, as shown in FIG. 3A.

Figure 3B:
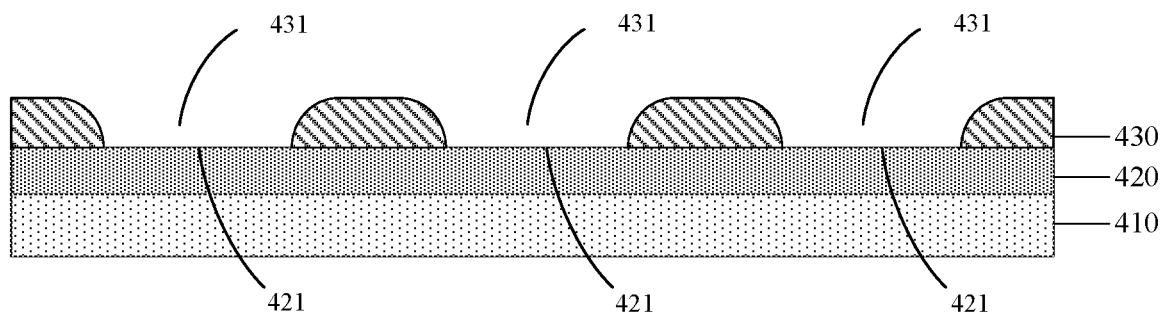

At step S220, a pixel define layer 430 is formed over the first electrode layer 420, as shown in FIG. 3B. The pixel define layer may be used to define the sub-pixel units, such as, R, G, B sub-pixel units (referring to FIG. 3F). The pixel define layer 430 may have at least one opening 431. Each of the openings 431 may expose a part 421 of the first electrode layer 420.

Figure 3C:
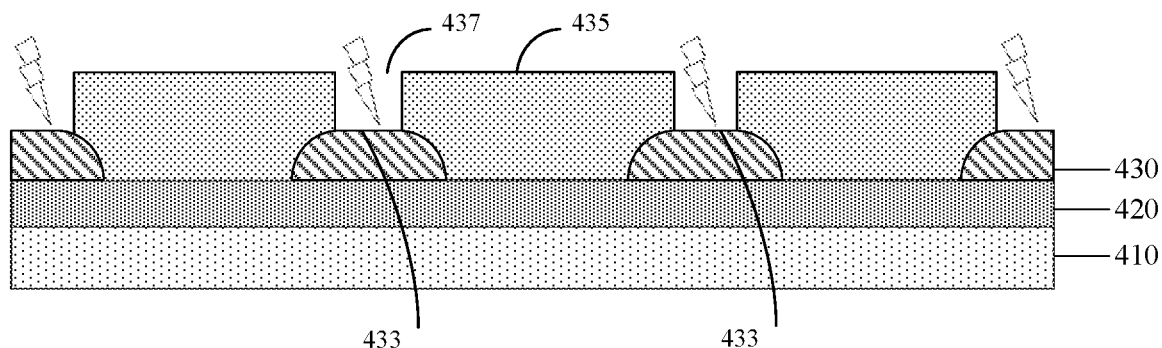

At step S230, a roughening process is performed on at least a part 433 of an upper surface of the pixel define layer 430 to form a rough surface, as shown in FIG. 3C. The upper surface of the pixel define layer may be a surface away from the first electrode layer.

Figure 3D:
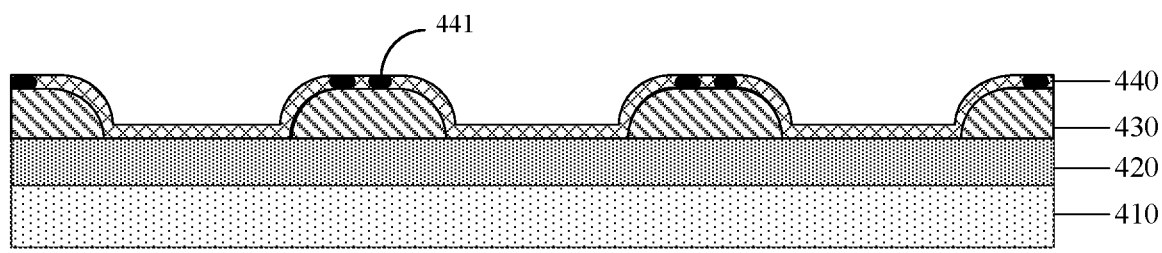

At step S240, a functional layer 440 is formed to cover the roughening-processed pixel define layer and the exposed part of the first electrode layer, as shown in FIG. 3D. The functional layer may comprise a functional layer for a light-emitting part of a pixel unit or a sub-pixel unit, for example but not limited to, hole injection layer.

Figure 3E:
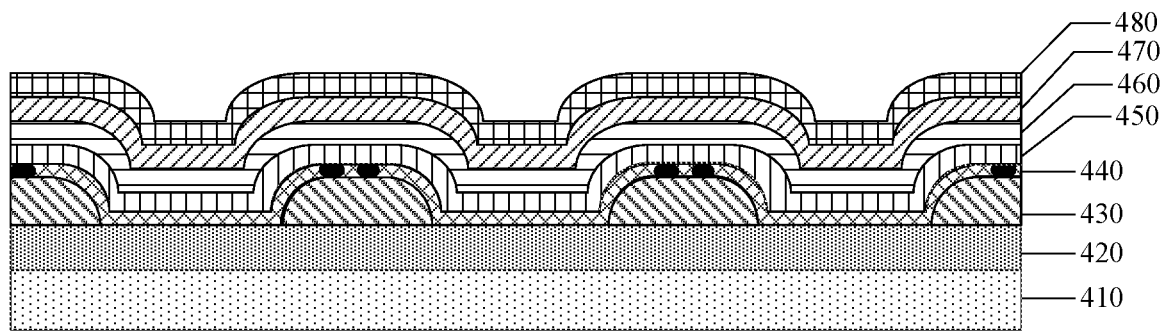
Figure 3F:
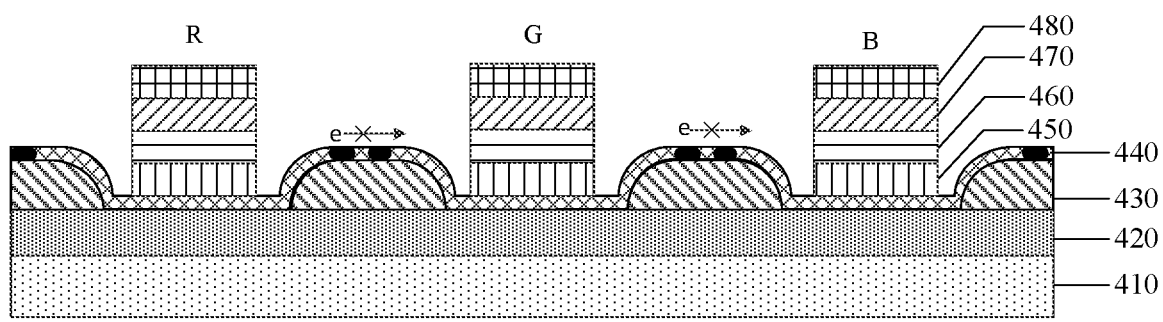

Because of the roughening process, the part 441 of the HIL, that is formed over the rough surface, has a lowered carrier transporting capability in a direction, which the HIL extends in, than other parts of the HIL, as will be further described in reference to FIG. 3F. Here, in the part 411 of the HIL formed over the rough surface, the reduction of the carrier-transporting capability in the extending direction of the HIL is schematically illustrated with black dot in FIG. 3D. In some embodiments, the reduction of the carrier transporting capability may include, as appropriate, such a case that the transporting of the carriers in the extending direction of the HIL is blocked.

It may need to be further noted that, although the HIL is described as the first functional layer, the present disclosure is not limited thereto. For example, it is also contemplated that the EIL or ETL may function as the first functional layer when appropriate.

In an implementation, the method may further comprise a step S250 at which a stack of functional layers, as well as a second electrode layer 480 over the stack, is formed over the HIL. As an example, the stack may include: a hole transport layer (HTL) 450 over the HIL, a light emitting layer (EML) 60 over the HTL, and an electron transport layer (ETL) 470 over the EML, as shown in FIG. 3E. Those skilled in the art would readily understand that the structure of the stack as shown in FIG. 3E is only illustrative, and one or more additional layer may be incorporated into the stack or a certain layer can be omitted from the stack as needed.

In an alternative embodiment, the order of the functional layers for the light-emitting region of the subpixel can be reversed; for example, over the first electrode layer, a stack of ETL, EML, HTL and HIL as well as a second electrode layer over the stack can be formed. Optionally, the stack may further comprises a electron injection layer (EIL) disposed between the first electrode layer and the ETL. In such an embodiment, the EIL or the ETL may function as the first functional layer.

The method may further includes a step S260 at which etching is performed from the second electrode layer through the stack and to the HIL, so as to form subpixel unit (as indicated with R, G, B), as shown in FIG. 3F. As an example, the etching can be configured to be stopped at the HIL. Here, the expose parts 421 of the first electrode layer (referring to FIG. 3B) may at least correspond to a respective light emitting layer (e.g., R, G, B).

It should be noted that the embodiment shown in FIG. 2 is just illustrative, and not for limiting. In some other embodiments, different processed can be used to form the light-emitting regions.

According to the method of manufacturing an OLED device provided in the embodiments, a roughening process is performed on a surface of the pixel define layer, so that the hole injection layer is wrinkled, fractured or unevenly deposited when the hole injection layer is formed, thereby greatly reducing the carrier transportability in the extending direction of the hole injection layer, and reducing the occurrence of crosstalk. On the other hand, since the surface process on the pixel define layer is performed before the starting of a evaporating deposition process of the HIL, the interference to the evaporating deposition process and to the property of the HIL to be formed can be reduced, and the manufacturing cost can be reduced.

Next, some details for the methods of manufacturing an OLED device according to the embodiments will be described.

In some illustrative embodiments, the first electrode may be used as an anode. Anode can used to supply holes. The first electrode may be formed over a substrate. The substrate may further comprise switch devices, an insulating layer, etc. The materials for the first electrode may vary depending on the type of the OLED device. For example, in a case of bottom-light emitting OLED device, the first electrode can be a transparent electrode layer. And in a case of a top-light emitting OLED device, the first electrode can be a reflective electrode layer.

Further, in the case that the first electrode layer is a transparent electrode layer, the first electrode layer may be formed with a transparent conductive material having a relatively large work function, such as indium tin oxide (ITO), zinc tin oxide (ZTO), indium zinc oxide (IZO), zinc oxide, gallium indium zinc oxide (GIZO), etc. Further, in an illustrative embodiment, the first electrode layer may also be a composite layer including a transparent conductive material layer and a metal layer, for example, a composite layer of indium tin oxide/silver/indium tin oxide (i.e., ITO/Ag/ITO) composite layer.

In some embodiments of the present disclosure, a pixel define material layer can be formed over the first electrode layer; then the pixel define material layer can be patterned to form the pixel define layer having the opening(s) 431 and the pixel spacer(s) 433. Each opening may correspond to one or more pixels or sub-pixels (or, the light-emitting region thereof). The opening can be configured to be surrounded by the pixel spacer. Those skilled in the related arts would readily know the processes for patterning the pixel define material layer; for example, the pixel define material layer can be patterned with at least exposure, development, and etching (wet etching or dry etching), etc.

In the illustrative embodiments, in order to adjust the surface roughness of the pixel define layer, a surface of the pixel define layer (PDL) may be processed according to the thickness of the hole injection layer, so that the pixel define layer has a surface roughness that can prevent the directional transport of carriers in the hole injection layer (for example, in the extending direction of the HIL). The surface process performed on the pixel define layer may comprise: performing a surface process on the pixel define layer through an ashing process. However, the surface process of the illustrative embodiments of the present disclosure is not limited thereto; for example, the surface of the pixel define layer can be processed through a plasma process or a metal sputtering process, which are also embraced within the scope of the present disclosure. For instance, in an implementation, the certain sites of interest of the pixel define layer (PDL) can be processed by sputtering with metal, so as to increase the roughness of the sites, and a thin film of metal is thus formed on the sites, so that the HIL layer formed thereon may be wrinkled, ruptured, or unevenly deposited. Here, it should be noted that a main purpose of this implementation is to increase the surface roughness, and the thin metal film is only a byproduct. And, in some other similar implementation, the thin metal film may be not needed.

In some illustrative embodiments, as shown in FIG. 3C, the surface process on the certain parts of the pixel define layer 320 may comprise: forming a mask 435 over the pixel define layer and the exposed parts of the first electrode layer, the mask exposing at least a part 433 of the upper surface of the pixel define layer; performing a surface process 437 on the exposed surface of the pixel define layer by an ashing process, etc. (that is, performing an ashing process etc. on said at least a part 433 of the upper surface of the pixel define layer); and removing the mask after the surface process. In an illustrative embodiment, the ashing process may be a dry ashing using oxygen plasma, ozone or the like. The present disclosure shall not be limited thereto. For example, the ashing process may be a wet ashing using a mixed solution of hot sulfuric acid or peroxide.

In other illustrative embodiments, other appropriate technical solutions may also be employed for the roughness process on the PDL surface, such as a plasma process performed on the surface of the PDL or sputtering onto the corresponding portion of the PDL layer. For these solutions, the processes as above-described in connection with ashing process can be similarly or adaptively applied, and thus repeat description there will be omitted. In some embodiments, depending on the thickness of the HIL to be formed thereon, the roughness of the PDL layer can be adjusted in a range of 50-100 nm; which is illustrative and not for limiting the present disclosure.

As an illustrative example, the mask may comprise photoresist (PR). After the ashing process or the like is performed on a surface of the PDL which has pixel-definition function, so as to increase its surface roughness, the mask can be removed. Then, HIL, HTL, etc. can formed in a conventional way. In the deposition of the HIL layer, due to the increased surface roughness of the underlying PDL layer (for example, the RA may be controlled to be in a range of about 50 nm to about 100 nm), when a HIL layer of, for example, about 50 nm to about 100 nm is deposited, the HIL layer will be wrinkled, ruptured, or unevenly deposited, so that its carrier transport capacity is greatly reduced, and the occurrence of crosstalk may be reduced. It should be noted that although a PLD with a surface roughness (RA) of about 50 nm to about 100 nm and a HIL with a thickness of about 50 nm to about 100 nm is set forth here as an example, this is just illustrative. Those skilled in the related arts would readily understand that the present disclosure shall not be limited to those specific embodiments with specific numbers. There is no special limits to the RA of the PDL as long as the RA of the PDL is configured so that the carrier transport capability of the HIL formed on the PDL can be reduced. For example, the RA of the PLD can be configured to be comparable or close to the thickness of the HIL to be formed on the PLD.

Further, since the surface process to the pixel define layer is performed before the formation of the functional layers of the display region of the pixel, the interference to the forming process of the functional layers can be reduced, the performance of the device can be prevented from being degrade, and the manufacturing cost can be reduced.

In some illustrative embodiments, the hole injection layer (HIL) can facilitate the injection of holes from the first electrode layer to the HTL. The HIL can be formed using a hole injection material, such as any selected from a group consisted of: copper phthalocyanine (CuPc), Poly (3,4)-ethylenedioxythiophene (PEDOT), Polyaniline (PANI), or a mixture of any of these materials. The HIL may be obtained through a vacuum evaporation process, a thermal evaporation process, a slit coating process, a spin-coating process, a printing process and the like.

In some illustrative embodiments, the hole transport layer (HTL) may be formed using a hole transport material, such as any selected from a group consisted of: 4,4'-bis [N-(1-naphthyl)-N-phenylamino]biphenyl (NPB), N,N'-diphenyl-N,N'-bis(3-methylphenyl)-1,1'-biphenyl-4,4-diamine (TPD), N,N'-di-1-naphthyl-N,N'-biphenyl-1,1'-diphenyl-4,4'-diamine (NPD), N-phenyl carbazole, Polyvinyl carbazole or the like, or a mixture of any of these materials. The HIL may be obtained through a vacuum evaporation process, a thermal evaporation process, a slit coating process, a spin-coating process, or a printing process and the like.

In some illustrative embodiments, the light emitting layer (EML) may comprise a red light emitting layer, a green light emitting layer, and a blue light emitting layer. The EML may be formed using a suitable light emitting material for generating red, green, or blue light according to a light emitting mechanism of the EML, such as a fluorescence mechanism or a phosphorescent mechanism. This, however, is just an exemplary embodiment, and the present disclosure is not limited thereto. The light emitting layer EML can be obtained by a printing process including ink jet printing, spin printing or nozzle printing processes, or by a heat or laser transfer process using a base substrate.

In some illustrative embodiments, the electron transport layer (ETL) may be formed using, for example, tris (8-quinolinolato) aluminum (III) (Alq3), 2-(4-biphenyl)-5-4-tert-butylphenyl-1,3,4-oxadiazole (PBD), bis (2-methyl-8-quinolinolato)-4-phenylphenolato-aluminum (BAlq), 2,9-dimethyl-4,7-diphenyl-1,10-phenanthroline (BCP) or the like. The above compounds each may be used alone or in a mixture with other compound(s).

The second electrode layer may be formed of a transparent conductive material or a metal, depending on the type of the second electrode layer, such as being a transparent electrode or a reflective electrode. The transparent conductive material may comprise ITO, ZTO, IZO, ZnOx, SnOx, GIZO, AZO, and the like. The metal may comprise, for example, Ag, Al, Pt, Au, Cr, W, Mo, Ti, Pd or the like, or an alloy of any of these materials. The second electrode layer may be obtained by a sputtering process, a chemical vapor deposition (CVD) process, an atomic layer deposition (ALD) process, a vacuum deposition process, a printing process, or the like.

In some illustrative embodiments, an electron injection layer EIL may be further provided between the ETL and the second electrode layer. The electron injection layer EIL may be formed from material(s) selected from: alkali metal, alkaline earth metal, fluoride of these metals, oxide of these metals, or the like. The material as above-mentioned may be used alone or in a mixture with other material(s).

Besides, it should be understood that an OLED device is further provided. Refer to FIG. 3F, the OLED device may comprise a substrate 410 having a first electrode layer 420 thereon. The OLED device may further comprise a pixel define layer 430 for defining a sub-pixel unit (e.g., R, G, B subpixel unit) over the first electrode layer, the pixel define layer having at least one opening 431 each exposing a part 421 of the first electrode layer. The OLED device may further comprise. At least a part 433 of an upper surface, which surface is away from the first electrode layer, of the pixel define layer has a rough surface. The OLED device may further comprise a first functional layer 440 for a light-emitting part of the subpixel unit, formed over the pixel define layer and the exposed part of the first electrode layer. At least a part of an upper surface of the pixel define layer has a rough surface, so that a part of the first functional layer, that is formed over the rough surface, has a lowered carrier-transporting capability in a direction, which the first functional layer extends in, than other parts of the first functional layer.

In some illustrative embodiments, the OLED device may further comprise a stack of functional layers (e.g., 450, 460, and 470) over an area of the first functional layer corresponding to the respective opening, and a second electrode layer 480 over the stack.

In some illustrative embodiments, the first functional layer has a thickness of about 50 nm to about 100 nm, and the rough surface has a surface roughness of about 50 nm to about 100 nm. In some illustrative embodiments, the roughness can be determined on basis of the thickness of the HIL to be formed on the rough surface. Thus, in some other embodiments, the roughness can be other than about 50 nm to about 100 nm, and can be other values determined according to the thickness of the HIL to be formed. This is also included in the present disclosure.

In some illustrative embodiments, the first functional layer may comprise a hole injection layer, and the stack may comprise a hole transport layer over the hole injection layer, a light emitting layer over the hole transport layer, and an electron transport layer over the light emitting layer In some illustrative embodiments, the OLED device may further comprise an electron injection layer interposed between the electron transport layer and the second electrode.

In some illustrative embodiments, the first functional layer may comprise an electron injection layer or an electron transport layer. In some illustrative embodiments, the first electrode layer comprises a composite layer of indium tin oxide/silver/indium tin oxide.

According to the OLED devices provided in the embodiments, a roughening process is performed on selected parts of the surface of the pixel define layer, so that the hole injection layer is wrinkled, fractured or unevenly deposited when the hole injection layer is formed over the pixel define layer. Thereby, the carrier transportability of the first functional layer in a desirable direction can be greatly reduced, and crosstalk can thus be reduced. On the other hand, since the surface process to the pixel define layer is performed before the forming of the functional stack, the interference to the stack to be formed can be reduced or eliminated. Further, according to the embodiments of the present disclosure, cross-talk can be alleviated or addressed at a lower cost.

Besides, in some illustrative embodiments, a display panel is further provided which comprises the OLED device according to any of the embodiments described above.

Since the display panel according to the illustrative embodiments employs the OLED device as described above, it has at least all the advantages contributed by the OLED devices according to the present disclosure. In some illustrative embodiments, the display panel may comprise: OLED panel, cell phone, tablet, television, monitor, notebook computer, digital camera, or any other product or component having a display function. Of course, the present disclosure shall not be limited thereto.

Other embodiments of the present disclosure may readily occur to those skilled in the art when reading and practicing the present disclosure. The embodiments as described above can be arbitrarily combined one with another as appropriate. The preset application is intended to cover any variations, uses, or adaptations of the present disclosure that follow the general principles of the present disclosure and include those general knowledge or conventional measures in the art, which may be not described in detail in the specification. The specification and the embodiments are intended to be illustrative only, and the scope and spirit of the present invention shall be defined by the following claims.

It should be noted that the present disclosure is not limited to the precise embodiments that have been described above and illustrated in the drawings, and that various modifications and changes may be made without departing from the scope thereof. The scope of the present disclosure should be limited only by the following claims.

What is claimed is:

1. A method of manufacturing an OLED device, comprising:
    providing a substrate having a first electrode layer thereon;
    forming a pixel define layer for defining a sub-pixel unit over the first electrode layer, the pixel define layer having at least one opening each exposing a part of the first electrode layer;
    performing a roughening process on one or more first parts of an upper surface of the pixel define layer, which is away from the first electrode, so that the one or more first parts of the upper surface of the pixel define layer each have a rough surface, the upper surface of the pixel define layer further having one or more second parts which are not processed by the roughening process; and
    forming a first functional layer to cover the processed pixel define layer and the exposed part of the first electrode layer,
    wherein one or more parts of the first functional layer, which are formed over the rough surface(s), have a carrier-transporting capability in a direction which the first functional layer extends in, less than that of other parts of the first functional layer,
    the method further comprising:
    forming a stack of functional layers over the first functional layer and a second electrode layer over the stack; and
    etching the second electrode layer and the stack to the first functional layer, so that the stack is remained over an area of the first functional layer corresponding to the respective opening, and not over an area of the first functional layer corresponding to the one or more first parts of the upper surface of the pixel define layer,
    wherein a surface roughness of the processed pixel define layer is determined according to a thickness of the first functional layer,
    wherein the thickness of the first functional layer ranges from 50 nm to 100 nm, and the surface roughness of the pixel define layer ranges from 50 nm to 100 nm, and
    wherein the first functional layer is an entire layer disposed over the processed pixel define layer and the exposed part of the first electrode layer and is in direct contact with the rough surface of the pixel defining layer.

2. The method according to claim 1, wherein the first functional layer is a functional layer for a light-emitting part of the sub-pixel unit, and
    wherein the first functional layer is a hole transport layer (HTL).

3. The method according to claim 1,
    wherein the exposed part of the first electrode layer corresponds to a respective light-emitting region.

4. The method according to claim 1, wherein performing a roughening process on at least a part of an upper surface of the pixel define layer comprises:
    performing an ashing process, a plasma process, or a sputtering process with metal, on said at least a part of the upper surface of the pixel define layer.

5. The method according to claim 4, wherein performing a roughening process on at least a part of an upper surface of the pixel define layer comprises:
    forming a mask over the pixel define layer and the exposed part of the first electrode layer, the mask exposing said at least a part of the upper surface of the pixel define layer;
    performing a surface process on said at least a part of the upper surface of the pixel define layer by an ashing process, a plasma process, or a sputtering process with metal; and
    removing the mask after the surface process.

6. The method according to claim 1, wherein performing a roughening process on at least a part of the upper surface of the pixel define layer is conducted according to a thickness of the first functional layer.

7. The method according to claim 1, wherein the first electrode layer comprises a composite layer of indium tin oxide/silver/indium tin oxide.

8. The method according to claim 1, wherein the first functional layer has a thickness of about 50 nm to about 100 nm, and the rough surface has a surface roughness of about 50 nm to about 100 nm.

9. The method according to claim 1, wherein:
    the first functional layer comprises a hole injection layer, and
    the stack comprises a hole transport layer over the hole injection layer, a light emitting layer over the hole transport layer, and an electron transport layer over the light emitting layer.

10. The method according to claim 9, wherein the stack further comprises an electron injection layer interposed between the electron transport layer and the second electrode layer.

11. The method according to claim 1, wherein the first functional layer comprises an electron injection layer or an electron transport layer.

12. The method according to claim 1, wherein the one or more parts of the first functional layer, which are formed over the one or more first parts of the upper surface of the pixel define layer, are ruptured.

13. An organic light-emitting diode (OLED) device, comprising:
    a substrate having a first electrode layer thereon;
    a pixel define layer for defining a sub-pixel unit over the first electrode layer, the pixel define layer having at least one opening each exposing a part of the first electrode layer; and
    a first functional layer over the pixel define layer and the exposed part of the first electrode layer,
    wherein an upper surface of the pixel define layer, which is away from the first electrode, has one or more first parts each of which has a rough surface and one or more second parts which do not have, so that one or more parts of the first functional layer, which are located over the rough surface(s), have a carrier-transporting capability in a direction which the first functional layer extends in, less than that of other parts of the first functional layer, the OLED device further comprising:
a stack of functional layers disposed over an area of the first functional layer corresponding to the respective opening, and not over an area of the first functional layer corresponding to the one or more first parts of the upper surface of the pixel define layer, and
a second electrode layer over the stack,
wherein a surface roughness of the pixel define layer is determined according to a thickness of the first functional layer,
wherein the thickness of the first functional layer ranges from 50 nm to 100 nm, and the surface roughness of the pixel define layer ranges from 50 nm to 100 nm, and
wherein the first functional layer is an entire layer disposed over the pixel define layer and the exposed part of the first electrode layer and is in direct contact with the rough surface of the pixel defining layer.

14. The OLED device according to claim 13, wherein:
the first functional layer comprises a hole injection layer, and
the stack comprises a hole transport layer over the hole injection layer, a light emitting layer over the hole transport layer, and an electron transport layer over the light emitting layer.

15. The OLED device according to claim 14, wherein the stack further comprises an electron injection layer interposed between the electron transport layer and the second electrode layer.

16. The OLED device according to claim 13, wherein the first functional layer comprises an electron injection layer or an electron transport layer.

17. The OLED device according to claim 13, wherein the first electrode layer comprises a composite layer of indium tin oxide/silver/indium tin oxide.

18. A display panel comprising the OLED device according to claim 13.

19. The OLED device according to claim 13, wherein the one or more parts of the first functional layer, that are located over the one or more first parts of the upper surface of the pixel define layer, are ruptured.

\* \* \* \* \*